United States Patent
Lai et al.

(10) Patent No.: US 12,300,636 B2
(45) Date of Patent: May 13, 2025

(54) SEAL RING STRUCTURE AND METHOD OF FABRICATING THE SAME

(71) Applicant: Taiwan Semiconductor Manufacturing Company, Ltd., Hsin-Chu (TW)

(72) Inventors: Yen Lian Lai, New Taipei (TW); Chun Yu Chen, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 450 days.

(21) Appl. No.: 17/737,563

(22) Filed: May 5, 2022

(65) Prior Publication Data

US 2023/0036280 A1 Feb. 2, 2023

Related U.S. Application Data

(60) Provisional application No. 63/227,188, filed on Jul. 29, 2021.

(51) Int. Cl.
*H01L 23/58* (2006.01)
*H01L 23/00* (2006.01)

(52) U.S. Cl.
CPC .......... *H01L 23/585* (2013.01); *H01L 23/562* (2013.01)

(58) Field of Classification Search
CPC ............................. H01L 23/585; H01L 23/562
See application file for complete search history.

(56) References Cited

U.S. PATENT DOCUMENTS

| | | | | |
|---|---|---|---|---|
| 10,121,755 B1* | 11/2018 | Bhatkar | ................ | H01L 23/562 |
| 10,692,786 B1* | 6/2020 | Lin | ........................ | H01L 23/055 |
| 11,676,893 B2* | 6/2023 | Lu | ........................... | H01L 23/585 |
| | | | | 257/774 |
| 2006/0012012 A1* | 1/2006 | Wang | .................... | H01L 23/562 |
| | | | | 257/E23.194 |
| 2006/0076651 A1* | 4/2006 | Tsutsue | ................. | H01L 23/564 |
| | | | | 257/669 |
| 2008/0211109 A1* | 9/2008 | Kumagai | .............. | H01L 23/562 |
| | | | | 257/774 |
| 2009/0008750 A1* | 1/2009 | Tokitoh | ................. | H01L 23/562 |
| | | | | 438/618 |
| 2012/0313217 A1* | 12/2012 | Hung | .................... | H01L 23/585 |
| | | | | 257/532 |

(Continued)

FOREIGN PATENT DOCUMENTS

TW 202032728 A 9/2020

*Primary Examiner* — Evren Seven
(74) *Attorney, Agent, or Firm* — HAYNES AND BOONE, LLP

(57) ABSTRACT

The present disclosure provides a semiconductor structure that includes dielectric layers disposed over a semiconductor substrate; and a seal ring structure formed in the dielectric layers and distributed in multiple metal layers. The seal ring structure further includes first metal lines of a metal layer disposed in a first area and longitudinally oriented along a first direction; second metal lines of the metal layer disposed in a second area and longitudinally oriented along the first direction; and metal bars of the metal layer disposed in the first area and longitudinally oriented along a second direction, the metal bars connecting the first metal lines.

20 Claims, 15 Drawing Sheets

(56) References Cited

U.S. PATENT DOCUMENTS

| | | | |
|---|---|---|---|
| 2013/0026718 A1* | 1/2013 | Chang | H01L 23/564 |
| | | | 277/654 |
| 2013/0270710 A1* | 10/2013 | Chen | H01L 23/585 |
| | | | 257/774 |
| 2018/0158744 A1* | 6/2018 | Song | H01L 23/10 |
| 2019/0131251 A1* | 5/2019 | Wang | H01L 21/76898 |
| 2020/0066657 A1* | 2/2020 | Huang | H01L 23/10 |
| 2020/0075435 A1* | 3/2020 | Chen | H01L 22/34 |
| 2020/0312715 A1* | 10/2020 | Choi | H01L 21/76838 |

* cited by examiner

SEAL RING STRUCTURE AND METHOD OF FABRICATING THE SAME

PRIORITY

This application claims the benefit to U.S. Provisional Application Ser. No. 63/227,188 filed Jul. 29, 2021, the entire disclosures of which is incorporated herein by reference.

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each circuit die. This seal ring is formed during fabrication of the many layers that comprise the circuits, including both the front-end-of-line (FEOL) processing and back-end-of-line processing (BEOL). The FEOL includes forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, due to the shrinkage of circuits' critical dimension and metal routing density, there is an increased demand for better structure robustness and line density. Both the structure robustness and the line density of the seal ring are critical factors to impact the IC manufacture process, especially the dicing process and the chemical mechanical planarization (CMP) process. Improved seal ring quality, such as better structure robustness and improved line density, would improve the designed function of seal rings and the manufacturing processability. Therefore, improvements in these areas as well as other improvements of seal rings are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
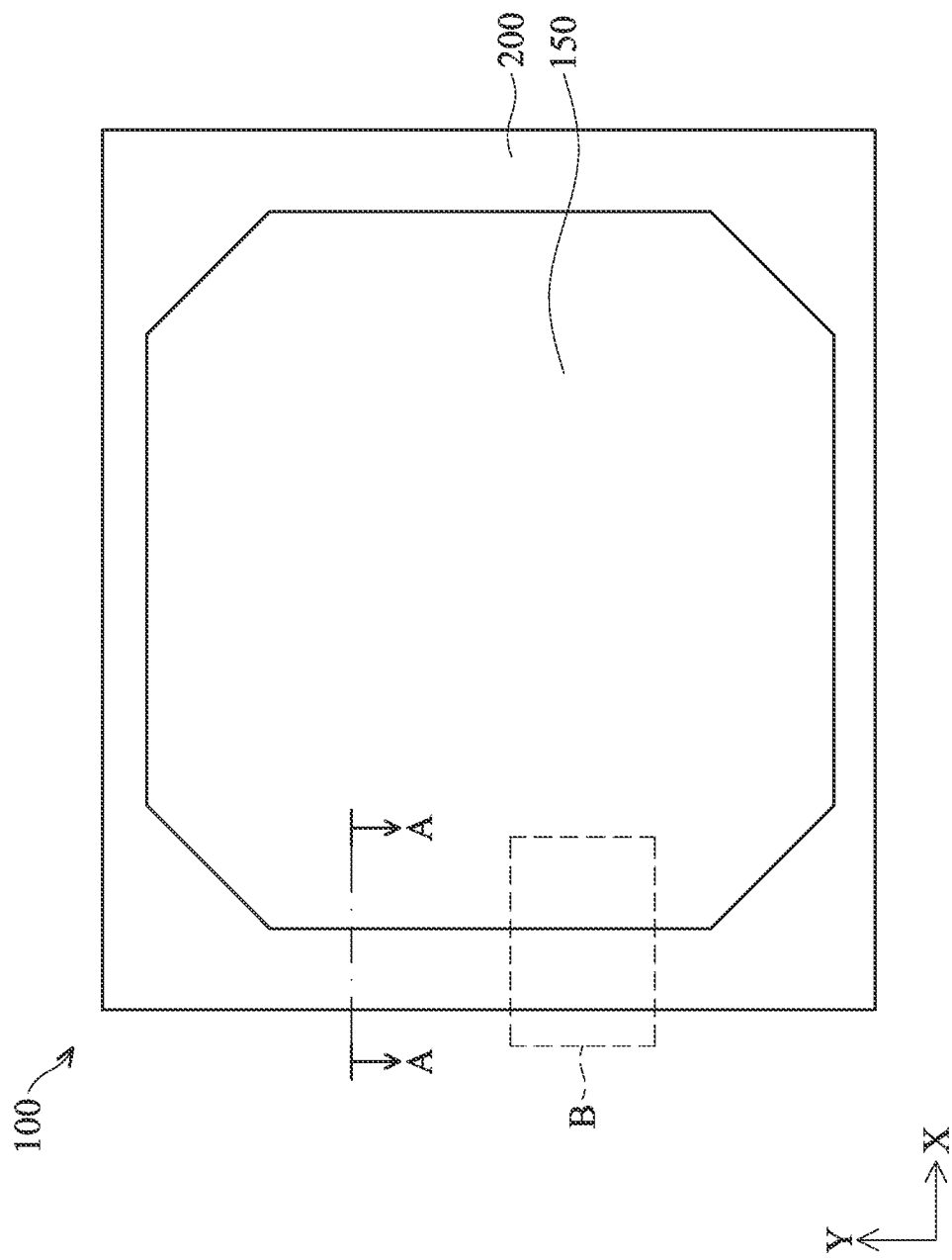
FIG. 1 is a top plan view of an integrated circuit die with a seal ring structure according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor seal ring structures. In some embodiments of the present disclosure, the seal ring structure includes a property enhancing structure (PES). The PES improves the ability of the seal ring to withstand stress during dicing and improves the manufacturing processability of the seal ring. In the present embodiments, the PES includes a ring (e.g., metal ring) or a ring-like structure around the circuit die. In some embodiments, the PES includes multiple groups (such as three) of rings disposed between sections (sub-rings) of the seal rings. Forming the PES in such manner increases the structure robustness. Such formed PES also balances the topography loading during various processes substantially, thereby reducing or eliminating dishing in the seal ring region during chemical mechanical planarization (CMP) processing. Those of ordinary skill in the art should appreciate that they may readily use the present disclosure as a basis for designing or modifying other processes and structures for carrying out the same purposes and/or achieving the same advantages of the embodiments introduced herein.

Figure 5:
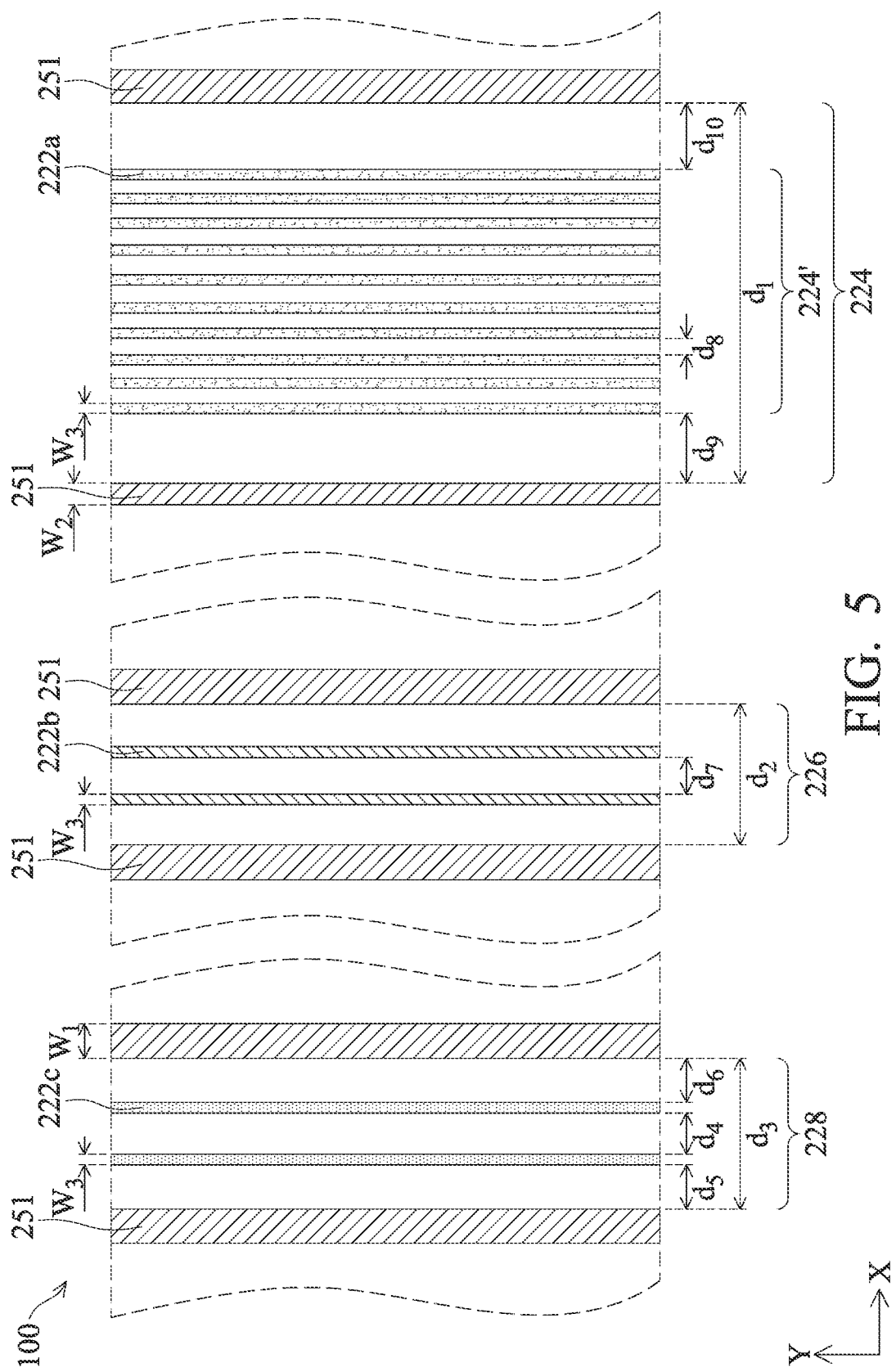
FIG. 5 is a top plan view of the integrated circuit die, in the "B" region of FIG. 1, according to various aspects of the present disclosure.

Referring now to FIG. 1, a top plan view of a semiconductor structure (or semiconductor device) 100 is illustrated including one or more circuit elements 150 (such as transistors, resistors, capacitors, memories, etc.) surrounded by a seal ring structure 200. A cross-sectional view of an embodiment of the semiconductor structure 100 along the A-A line in FIG. 1 is illustrated in FIG. 2, and a magnified top plan view of a portion B of the semiconductor structure 100 according to various embodiments are illustrated in FIGS. 3 and 5.

Figure 2:
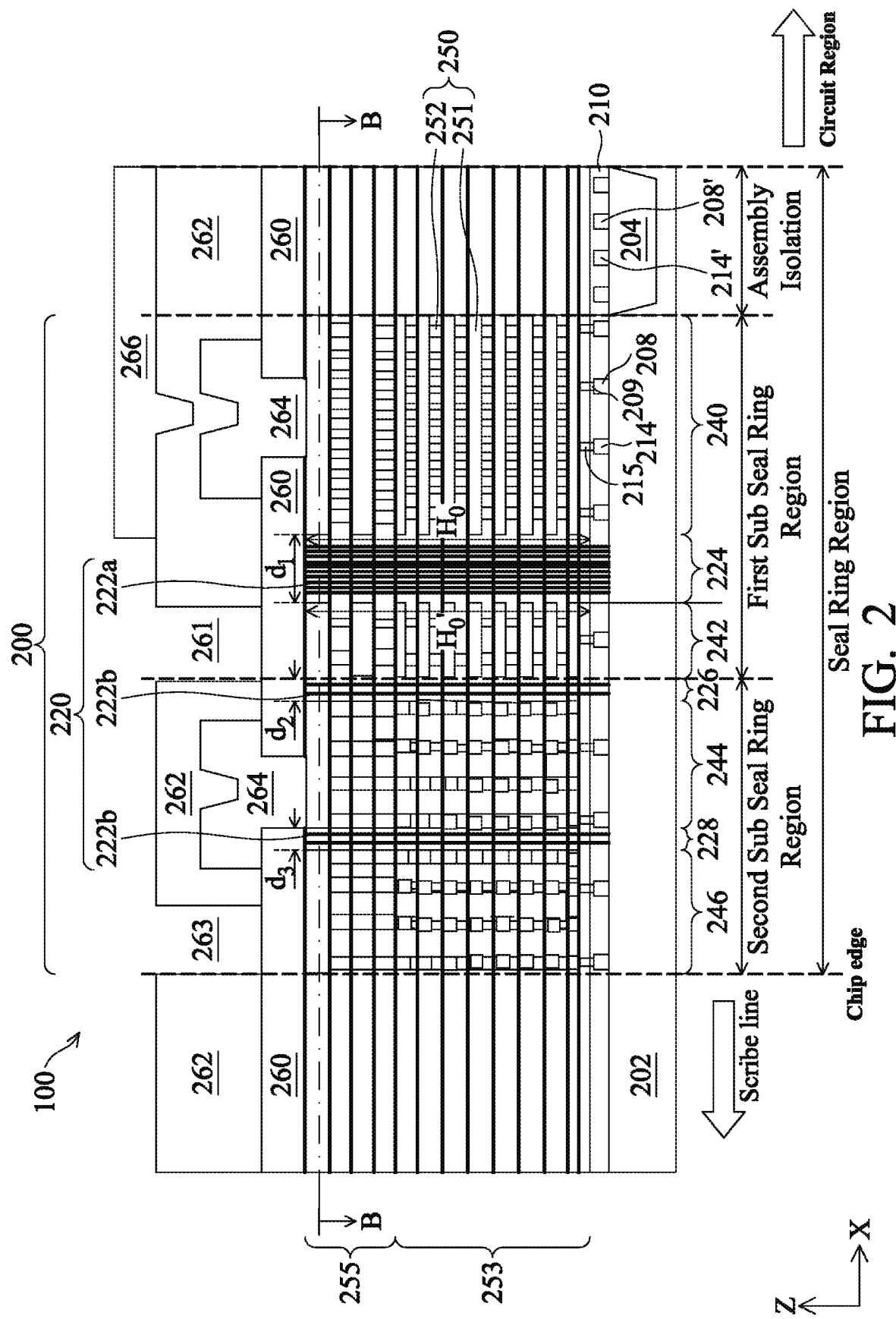
FIG. 2 is a cross-sectional view of an embodiment of the integrated circuit die including a seal ring region, along the "A-A" line of FIG. 1, according to various aspects of the present disclosure.
Figure 3:
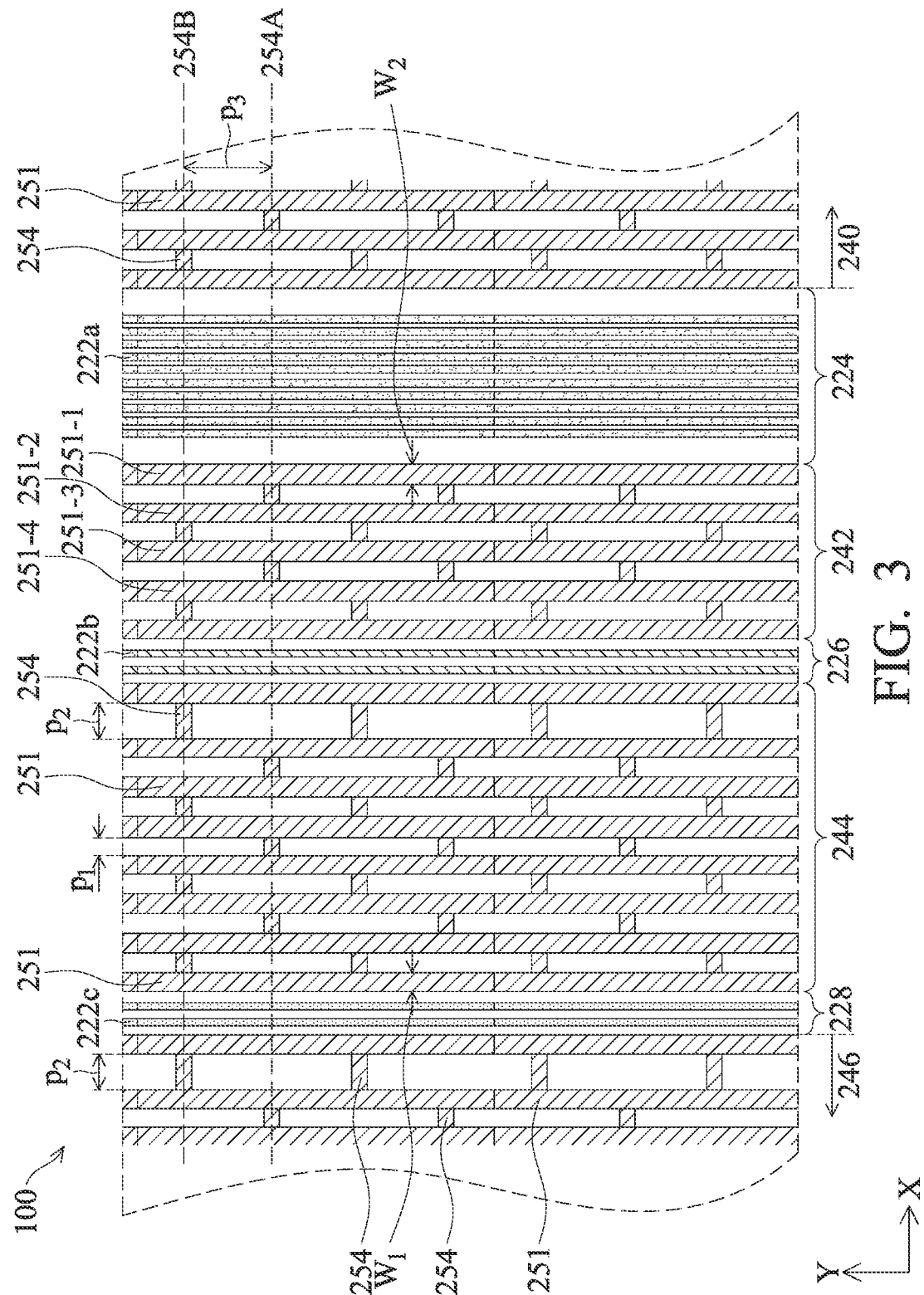
FIG. 3 is a top plan view of the integrated circuit die, in the "B" region of FIG. 1, according to various aspects of the present disclosure.

Referring to FIG. 2, the semiconductor structure 100 includes a substrate 202. The substrate 202 is a silicon substrate in the present embodiment. The substrate 202 may alternatively include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. The substrate 202 may include doped active regions such as a P-well and/or an N-well. The substrate 202 may also further include other features such as a buried layer, and/or an epitaxy layer. Furthermore, the substrate 202 may be a semiconductor on insulator such as silicon on insulator (SOI). In other embodiments, the semiconductor substrate 202 may include a doped epitaxy layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a multilayer compound semiconductor structure. The active region may be configured as an NMOS device (e.g., nFET) or a PMOS device (e.g., pFET). The substrate 202 may include underlying layers, devices, junctions, and other features (not shown).

The substrate 202 includes a seal ring region, over which the seal ring structure 200 is formed. The substrate 202 further includes a circuit region, over which the circuit elements 150 are formed. The substrate 202 further includes an assembly isolation region between the seal ring region and the circuit region and a scribe line region surrounding the seal ring region. During dicing, the semiconductor structure 100 is cut (for example, using a dicing saw or a laser) along the scribe line region, thereby forming a device or semiconductor chip (or an IC die) having the circuit elements 150 surrounded by the assembly isolation and the seal ring structure 200.

The seal ring region further includes two sub seal ring regions, a first sub seal ring region and a second sub seal ring region. The first sub seal ring region is between the second sub seal ring region and the assembly isolation region. The first sub seal ring region is wider than the second sub seal ring region in the present embodiment. For example, the second sub seal ring region may be about 70% to 90% as wide as the first sub seal ring region. The second sub seal ring region is wider than the assembly isolation region. For example, the assembly isolation region may be about 70% to 90% as wide as the second sub seal ring region. In some embodiments, the width of the assembly isolation region may be in a range of about 5 microns to about 6 microns, the width of the first sub seal ring region may be in a range of about 8 microns to about 10 microns, and the width of the second sub seal ring region may be in a range of about 6 microns to about 8 microns.

Seal rings 240 and 242 are formed in the first sub seal ring region. Seal rings 244 and 246 are formed in the second sub seal ring region. The seal ring structure 200 includes the seal rings 240, 242, 244, and 246. The seal ring 240 is wider than the seal rings 242, 244, and 246, thus may be referred to as the main seal ring. Seal rings 244 and 246 have about the same width. Seal ring 242 is narrower than the seal rings 240, 244, and 246. The seal ring 246 encloses (or surrounds) the seal ring 244, the seal ring 244 in turn encloses the seal ring 242, the seal ring 242 further encloses seal ring 240, and the seal ring 240 encloses the circuit die 150 from a top view. Having multiple nested seal rings ensures that the inner seal ring(s) is/are protected from cracks during dicing (e.g., die sawing). For example, the seal rings 246, 244 in the second sub seal ring region protect the seal rings 242, 240 in the first sub seal ring region from damages that may occur during dicing.

A first space between the seal ring 240 and the seal ring 242 is defined by a distance $d_1$ along X direction, a second space between the seal ring 242 and the seal ring 244 is defined by a distance $d_2$ along X direction, and a third space between the seal ring 244 and the seal ring 246 is defined by a distance $d_3$ along X direction. The distances $d_1$, $d_2$, and $d_3$ may be decided according to the design requirements of the seal ring structure 200. In some embodiments, the distances $d_1$, $d_2$, and $d_3$ may be the same as or different from each other. In the present embodiments, the distance $d_1$ is greater than the distance $d_2$, while the distance $d_3$ equals to the distance $d_2$. The distances $d_1$, $d_2$, and $d_3$ are each less than the width of the seal rings 240, 242, 244, or 246. Such spacing between seal rings further absorb stress and reducing its impact on the seal rings 240, 242, 244, and 246. This effect is especially noticeable for the main seal ring 240 due to the first space being wider than the second space and the third space, i.e., the distance $d_1$ is greater than the distances $d_2$ and $d_3$.

Each of the seal rings 240, 242, 244, and 246 may include one or more metal plugs 214 disposed on the substrate 202. Even though not shown in FIG. 2, the substrate 202 includes active regions (such as $N^+$ or $P^+$ doped regions) over which the one or more metal plugs 214 are disposed. In some embodiment, each metal plug 214 is formed into a multi-step profile with multiple sections that become wider as the height of the metal plug 214 increases. Having the multi-step profile improves the metal filling of the metal plugs 214 and eliminates seams and/or void in the metal plugs 214. This greatly enhances the mechanical connection between the seal ring structure 200 and the substrate 202.

Each of the seal rings 240, 242, 244, and 246 includes a connection structure 250 that includes multiple layers of metal lines 251 stacked one over another. The metal lines 251 are connected horizontally by metal bars 254 (shown in FIG. 3) and vertically by metal vias 252. Metal lines 251, metal bars 254, and metal vias 252 may comprise copper, copper alloys, or other conductive materials and may be formed using damascene or dual damascene processes. Each of the metal lines 251, the metal bars 254, and the metal vias 252 may include a conductive barrier layer (such as TiN or TaN) surrounding a metal core (such as copper). Each of the seal rings 240, 242, 244, and 246 further includes vias 215 that connect the metal plugs 214 to the connection structure 250. In an embodiment, the vias 215 include tungsten. In alternative embodiments, the vias 215 include tungsten, cobalt, titanium, tantalum, ruthenium, or a combination thereof. In an embodiment, each of the metal lines 251 is formed into a ring or a ring-like structure (such as a substantially square ring) that surrounds the circuit region. In other words, each of the metal lines 251 is formed into a closed structure and extends along the edges of the area occupied by the circuit elements 150. In the present embodiment, a ring or a ring-like structure refers to a closed structure, which may be rectangular, square, substantially rectangular, substantially square, or in other polygonal shapes. In the present embodiment, each of the seal rings 240 and 244 (main seal rings) further includes an aluminum pad 264 disposed on the connection structure 250.

In some embodiment, the seal rings 240, 244, and 246 further include dummy gates 208 and dummy gate vias 209 that connect the dummy gates 208 to the connection structures 250. The semiconductor structure 100 further includes an interlayer 210 over the substrate 202 and extends across the circuit region, the assembly isolation region, the seal ring region, and the scribe line. In the assembly isolation region, the semiconductor structure 100 includes a plurality of metal plugs 214' and a plurality of dummy gates 208' that are disposed on an isolation structure (such as shallow trench isolation) 204. The isolation structure 204 may include silicon oxide, silicon nitride, silicon oxynitride, other suitable isolation material (for example, including silicon, oxygen, nitrogen, carbon, or other suitable isolation constituent), or combinations thereof. Isolation structure 204 can include different structures, such as shallow trench isolation (STI) structures and/or deep trench isolation (DTI) structures. The metal plugs 214, 214' and the dummy gates 208 and 208' are disposed at least partially in the interlayer 210. Having the plurality of dummy gates 208 and 208' in the seal ring region and in the assembly isolation region reduces dishing in the seal ring region during CMP processing of the device 100. The dummy gates 208 and 208' may be formed by depositing various material layers and etching/patterning the various material layers to form gate structures. Each dummy gate 208 and 208' may include a dummy gate dielectric layer (such as a layer having silicon dioxide, silicon oxynitride, a high-k dielectric layer, and/or other materials) and a dummy gate electrode layer (such as a layer having polysilicon or a metallic material). The dummy gates 208, 208' may be formed using a gate first process or a gate last process. The interlayer 210 may include one or more dielectric materials such as silicon oxide, silicon nitride, or other suitable materials. The interlayer 210 may be deposited using CVD, ALD, or other suitable processes.

The semiconductor structure 100 further includes a stack of dielectric layers 253 over the interlayer 210 and a stack of dielectric layers 255 over the dielectric layers 253. The connection structures 250 are disposed within (or embedded in) the dielectric layers 253 and 255. In an embodiment, the dielectric layers 253 are formed of a low-k dielectric material. For example, the dielectric constants (k values) of the dielectric layers 253 may be lower than 3.0, and even lower than about 2.5, hence may be referred to as extreme low-k (ELK) dielectric layers 253. In an embodiment, the dielectric layers 253 include silicon oxide, silicon nitride, silicon oxynitride, TEOS formed oxide, PSG, BPSG, low-k dielectric material, other suitable dielectric material, or combinations thereof. In an embodiment, the dielectric layers 255 may be formed of un-doped silicate glass (USG) in order to improve the mechanical property and prevent moisture penetration.

The semiconductor structure 100 further includes a passivation layer 260 over the dielectric layers 255 and another passivation layer 262 over the passivation layer 260. Each of the aluminum pads 264 includes a top portion that is disposed over the passivation layer 260 and a bottom portion that penetrates the passivation layer 260 and electrically connects to the connection structure 250. In an example, the top portion of each aluminum pad 264 may have a width about 3 microns to about 4 microns, and the bottom portion of each aluminum pad 264 may have a width about 1.5 microns to about 2 microns.

In an embodiment, each of the aluminum pads 264 is formed into a shape of a ring that surrounds the circuit region. Thus, the aluminum pads 264 may also be referred to as aluminum pad 264. Aluminum pad 264 may be formed simultaneously with the formation of bond pads (not shown) that are exposed on the top surface of IC die. The passivation layer 262 is disposed over the passivation layer 260 and the aluminum pad 264. The passivation layers 260 and 262 may be formed of oxides, nitrides, and combinations thereof, and may be formed of the same or different materials.

A trench 261 is provided in the passivation layer 262 between the first and the second sub seal ring regions. Another trench 263 is provided in the passivation layer 262 between the scribe line and the second sub seal ring region. In an embodiment, each of the trenches 261 and 263 is formed into a shape of a ring surrounding the circuit region. An advantageous feature of the dual trenches 261 and 263 is to help stopping a crack spreading that may occur in the scribe line during dicing. The trench 263 helps further reduce the stress of the crack if the crack propagates across the trench 261. In an embodiment, each of the trenches 261 and 263 is designed to have a width about 1.5 microns to about 2 microns. The nested seal rings 246, 244, 242, and 240, the dual trenches 263 and 261 improves the operational reliability of the seal ring structure 200.

In some embodiment, the semiconductor structure 100 further includes a layer 266 that is disposed over the passivation layer 262 and extends in the assembly isolation region and the first sub seal ring region. In an embodiment, the layer 266 includes a material such as organic polyimide and provides stress buffer for protecting the circuit die after package assembly. The layer 266 is optional and can be omitted from the semiconductor structure 100 in an alternative embodiment.

The differences between the metal structure of the seal rings (e.g., 242, 244, and etc.) and the metal structure of the PERs (e.g., 224) are further described with reference to FIG. 3 in a top view. Referring to FIG. 3, the metal lines 251 are parallel to each other and connected by metal bars 254. The metal lines 251 are connected by the metal bars 254 to bear stronger stress and enforce the structure robustness of the metal rings 240, 242, 244, and 246. The metal bars 254 are discontinuously disposed into various groups, and each group of the metal bars are aligned along a line in a direction (X direction) different from the longitudinal direction (Y direction) of the metal lines 251. Each group of metal bars 254 can be seen as a discontinuous metal line longitudinally oriented along a direction different from a direction of the lengthwise direction of the metal lines 251. Accordingly, each group of metal bars 254, as a discontinuous metal line, is referred to as a metal bar line, such as metal bar lines 254A, 254B and etc. In the present embodiments, the discontinuous metal bar lines are perpendicular to the metal lines 251. Each discontinuous metal bar line connects every other metal lines 251 perpendicular thereto. The adjacent metal bar lines connect different metal lines 251. For example, the metal bar line 254A connects the metal lines 251-1 to 251-2 and 251-3 to 251-4, but leaves the metal lines 251-2 and 251-3 disconnected. Similarly, the metal bar line 254B connects the metal lines 251-2 and 251-3, but leaves the metal lines 251-1 disconnected from 251-2 and 251-3 disconnected from 251-4. The metal bars 254 span across the space between metal lines 251 connected by the metal bars 254. The metal bars 254 are formed during the same process of forming the metal lines 251 and include the same materials as the metal line 251.

The metal bars 254 may have the same or different length along X direction. In the present embodiments, as depicted in FIG. 3, the metal bars 254 between the innermost two metal lines 251 in the seal rings 244 and the seal rings 246 has a pitch $p_2$, where the pitch $p_2$ is greater than a pitch $p_1$ of the rest of the metal lines 251. The metal bar lines may have the same or different line pitches. In the present embodiments, the metal bar lines have uniform pitch $p_3$ greater than the pitch $p_2$, where the pitch $p_3$ is measured from the center of the metal bar line 254A to the center of the metal bar line 254B along Y direction. The metal lines 251 may have the same width or different widths. For example, the outermost metal line 251 in the seal ring 244 has a width $w_1$ and the innermost metal line 251 in the seal ring 242 has a width $w_2$ different from (e.g., less than) the width $w_1$. In the present embodiments, the metal lines 251 have the same width $w_2$ that is the narrowest width of the metal lines 251.

In a typical circuit die, the seal ring structure and the trenches in the passivation layer serve to mitigate or alleviate the mechanical stress of the device, thereby preventing the forming of cracks or stopping the propagation of the cracks once formed. However, structure robustness needed to be further improved in many cases to better solve related issues including cracking, especially when the size of the device continues to decrease. The seal ring structure of the present embodiments solves these issues. For example, the seal ring structure of the present embodiments includes a property enhancing structure (PES) to increase the structure robustness. The PES is formed of one or more groups of property enhancing rings (PERs) disposed between sections of the seal ring structure, where each group includes one or more PERs. The PES is explained in detail below with respect to FIGS. 2 to 15.

Still referring to FIG. 2, the semiconductor structure 100 further includes a PES 220 having one or more PERs 222. The PERs 222 are disposed between sections of the seal ring structure 200 in groups. For example, the PERs 222 are divided into a group 224 disposed between the seal rings 240 and 242, a group 226 disposed between the seal rings 242 and 244, and a group 228 disposed between the seal rings 244 and 246. The PERs 222 in groups 224, 226, and 228 are denoted as 222a, 222b, and 222c respectively for easier reference. The denotations of the PERs 222 do not indicate any difference therebetween except what are explicitly stated.

Each group of PERs 222 may include the same number or different numbers of PERs 222. For example, a first number of the PERs 222a in group 224 is greater than a second number of PERs 222b in the groups 226 and a third number of PERs 222c in the group 228. In another example, the second number equals to the third number. In the present embodiments, the first number is five times of the second number or the third number to achieve designed functionality. Each group may include one or more PERs. In the present embodiments, the group 224 includes ten PERs 222a, the group 226 includes two PERs 222b, and the group 228 includes two PERs 222c. A height $H_0$ of the PERs 222 along Z direction is the same as or substantially the same as a height $H_0'$ of the seal rings 240, 242, 244, and 246, as shown in FIG. 2. The PERs 222 are configured as such to enhance the structure robustness and to provide good pattern density and good topography for subsequent processing. Detail of designing the PES 220 is explained below with respect to FIGS. 4 and 5.

Figure 4:
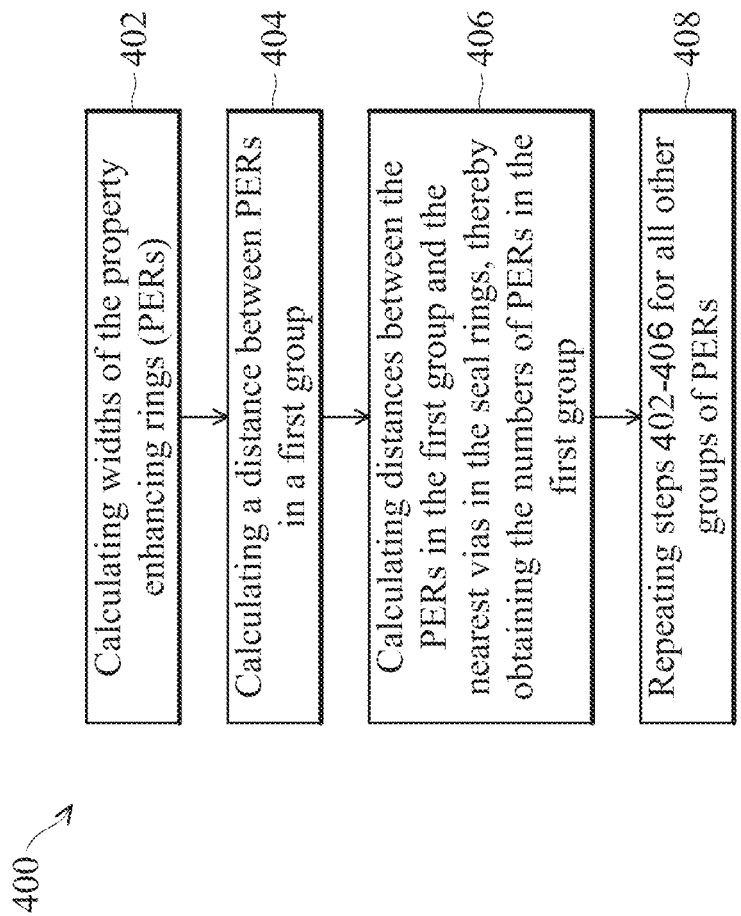
FIG. 4 is a flow chart of a method for calculating configurations of the property enhancing rings in the integrated circuit die, according to various aspects of the present disclosure.

The configurations of the PERs 222 in the groups 224, 226, and 228 are decided by multiple steps in method 400 as shown in FIG. 4. At step 402, referring to FIGS. 4 and 5, a width $w_3$ of each PER 222 is decided by the processing requirements, such as the lithography limitation, the processing simplicity, and/or accuracy. The width $w_3$ is designed to be narrower than the width $w_1$ or the width $w_2$. In one embodiment, a ratio of the width $w_2$ to the width $w_3$ ranges between 2 and 6. In another embodiment, a ratio of the width $w_2$ to the width $w_3$ ranges between 3 and 4. In yet another example, the width $w_3$ ranges between 40 nm and 80 nm, and the width $w_2$ ranges between 0.15 μm and 0.25 μm. In an example, the width $w_3$ is the smallest achievable width $w_s$ by lithography. In a different example, the width $w_3$ is greater than the smallest achievable width $w_s$ to balance with processing simplicity. In some embodiments, the PERs 222 may have the same width or different widths. In some embodiments, the PERs 222 in the same groups may have the same width, while the PERs 222 in different groups may have different width. In the present embodiments, the PERs 222a in the group 224, the PERs 222b in the group 226, and the PERs 222c in the group 228 have the same width $w_3$ that equals to the smallest achievable width $w_s$.

At step 404, the method 400 decide a distance $d_4$ between the nearest PERs 222a in group 228 as depicted in FIG. 5. In the present embodiments, the distance $d_4$ is first set to be the smallest achievable distance $d_s$ by lithography technology, and is further adjusted in the step 406 explained in detail below. Alternatively, the distance $d_4$ may be greater than the smallest achievable distance $d_s$.

At step 406, still referring to FIGS. 4 and 5, the method 400 decides the distances $d_s$ and de between the PERs 222a and the adjacent metal lines 251, thereby deciding the numbers of the PERs 222a in the group 228. In some embodiments, both the distances $d_s$ and de are greater than the distance $d_4$ but less than a sum of the width $w_3$ and the distance $d_4$, which means that the distance $d_s$ or the distance do is not wide enough to insert another PER 222a. In the present embodiments, the distances $d_s$ and $d_6$, as well as the numbers of the PERs 222a are first decided using a distance $d_4$ equals to the smallest achievable distance $d_s$, then the positions of the PERs 222a are further adjusted to be distributed evenly between the two metal lines 251 nearest to the group 228. In other words, the distance $d_4$ is the same as the distance $d_s$ and the distance $d_6$. In such configuration, the distance $d_4$ is greater than the smallest achievable distance $d_s$. In some embodiments, the distance $d_4$ is less than the pitch $p_1$. In one example, the distance $d_4$ is about 40% to 60% of the pitch $p_1$. In another example, the ratio of the distance $d_4$ to the pitch $p_1$ is about 0.15 to about 0.25. In still another example, the distance $d_4$ ranges from 70 nm to about 110 nm. A line density LD of group 228 is greater than a line density of $LD_2$ in the circuit elements 150.

At step 408, still referring to FIGS. 4 and 5, the method 400 repeats the steps 402 to 406 for the PERs 222b in the group 226. For example, the method 400 calculates a distance $d_7$ between the PERs 222b in the group 226 using the same process as for the group 228. In the present embodiments, the distance $d_2$ is the same as the distance $d_3$ and the distance $d_7$ is the same as the distance $d_4$. In other words, the configuration of the PERs 222b in the group 226 is the same as the configuration of the PERs 222c in the group 228. A line density LD' of group 226 is greater than a line density of $LD_2$ in the circuit elements 150.

The method 400 further calculates the numbers of the PERs 222a in the group 224 at step 408. A distance de between the nearest PERs 222a is set to be the same as the smallest achievable distance $d_s$, such that a line density $LD_1$ of the PERs 222a (shown in area 224' in FIG. 5) is greater than the line density $LD_2$ in the circuit elements 150. In the present embodiments, a distance de and a distance $d_{10}$ between the PERs 222a and the nearest two metal lines 251 are set to be greater than the distance de to keep the line density $LD_3$ the same as or substantially the same as the line distance $LD_2$. In one example, the distance do is about 2 to 2.5 times greater than the distance de. If the distance $d_0$ and/or $d_{10}$ are less than or equal to the distance $d_s$, the line density $LD_3$ may be greater than the line density $LD_2$, which is less desirable for subsequent processes than the case where the line density $LD_3$ is the same as the line density $LD_2$. In the present embodiments, both the distance de and the distance $d_{10}$ is greater than a sum of the width $w_3$ and the distance $d_s$ to meet the requirements in line density. In other words, the distance do and the distance $d_{10}$ are great enough to insert additional PERs 222a therein. However, the space between 222a and the nearest vias 252 is designed to be left empty without PERs 222a to balance line densities for subsequent processing. The line densities LD, LD', and $LD_1$ are used to increase a line density $LD_3$ of the seal ring structure 200 for better topography in subsequent processes, such as CMP. The increased line density $LD_3$ is the same as or substantially the same as the line density $LD_2$.

Figure 6:
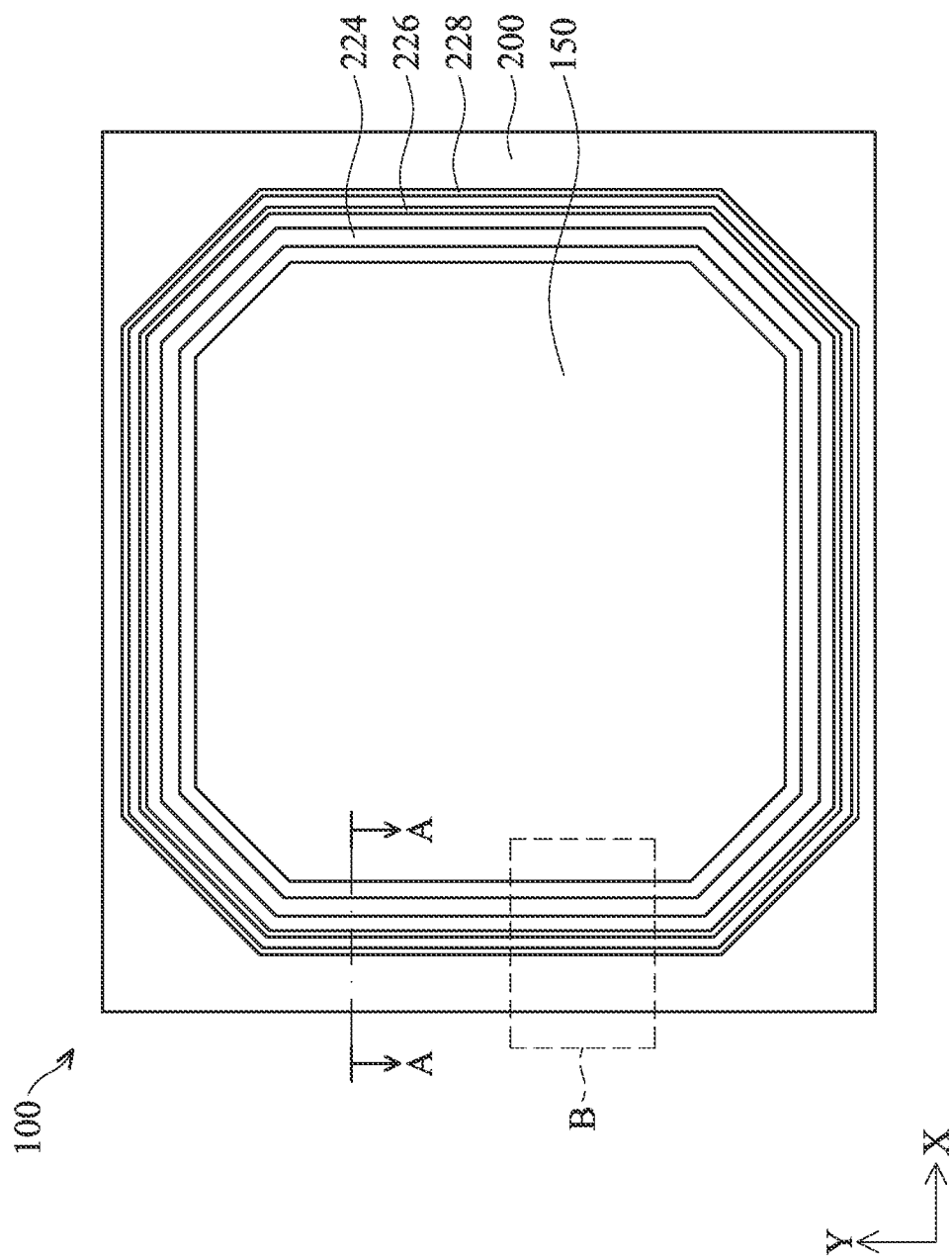
FIG. 6 is a top plan view of an embodiment of an integrated circuit die with a seal ring structure according to aspects of the present disclosure.

FIG. 6 illustrates a top plan view of the semiconductor structure 100 in the seal ring region according to an embodiment. In the illustrated embodiment, each group 224, 226, and 228 of the PERs 222 is formed into a rectangular structure parallel to each other from the top view, where the corners of the rectangular are replaced by slopes. In the present embodiments, the slopes each has a 45° angle with X direction. The group 224 encloses (or surrounds) the circuit elements 150, the group 226 encloses the group 224, and the group 228 encloses the group 226. Although the PERs 222 in the groups 224, 226, and 228 are not illustrated separately in FIG. 6, they are formed parallel to each other and parallel to the seal rings 240, 242, 244, and 246 as shown in FIGS. 3 and 5. In an embodiment, each PER 222 is formed as a continuous and closed structure (i.e., a ring) that surrounds the circuit elements 150. For simplicity, FIG. 6 illustrates the three groups of PERs 224, 226, and 228 and omits the seal rings 240, 242, 244, and 246, and other components of the seal ring structure. It is noted that the numbers of the PER groups are not limited to three, for example, the numbers of groups may range from 2 to 6.

Figure 7:
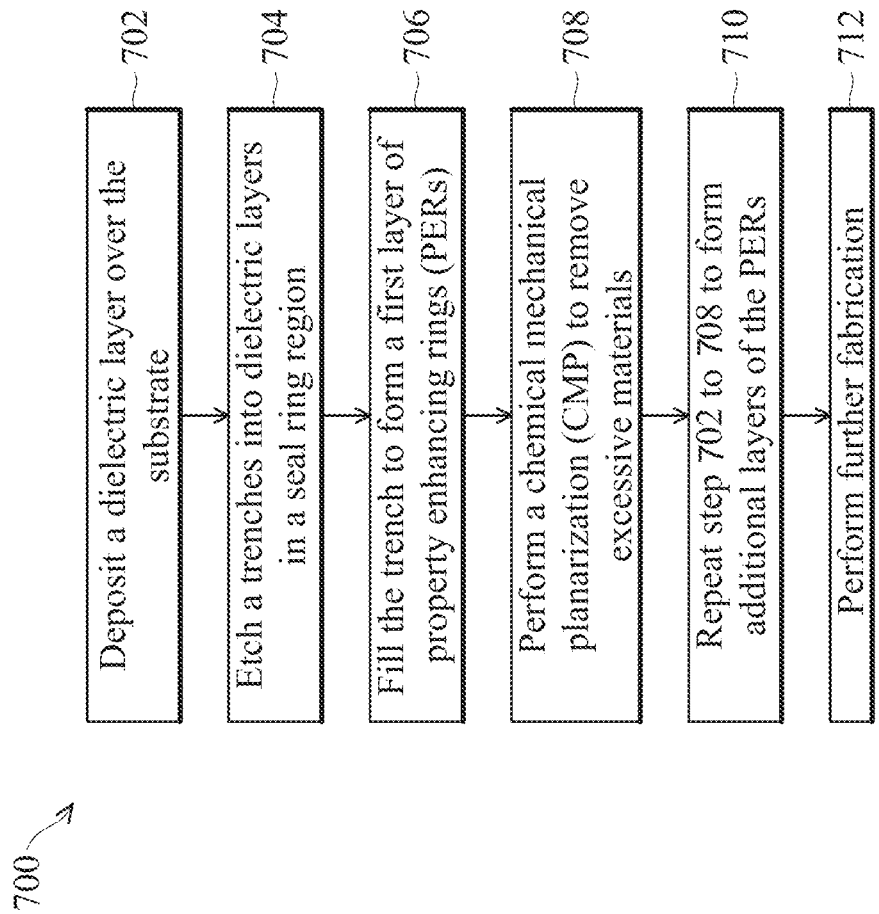
FIG. 7 is a flow chart of a method for forming an integrated circuit die with a property enhancing ring, according to various aspects of the present disclosure.

FIG. 7 illustrates a flow chart of a method 700 for forming the PERs 222, according to an embodiment of the present disclosure. Additional operations can be provided before, during, and after method 700, and some of the operations described can be moved, replaced, or eliminated for additional embodiments of method 700.

Figure 8:
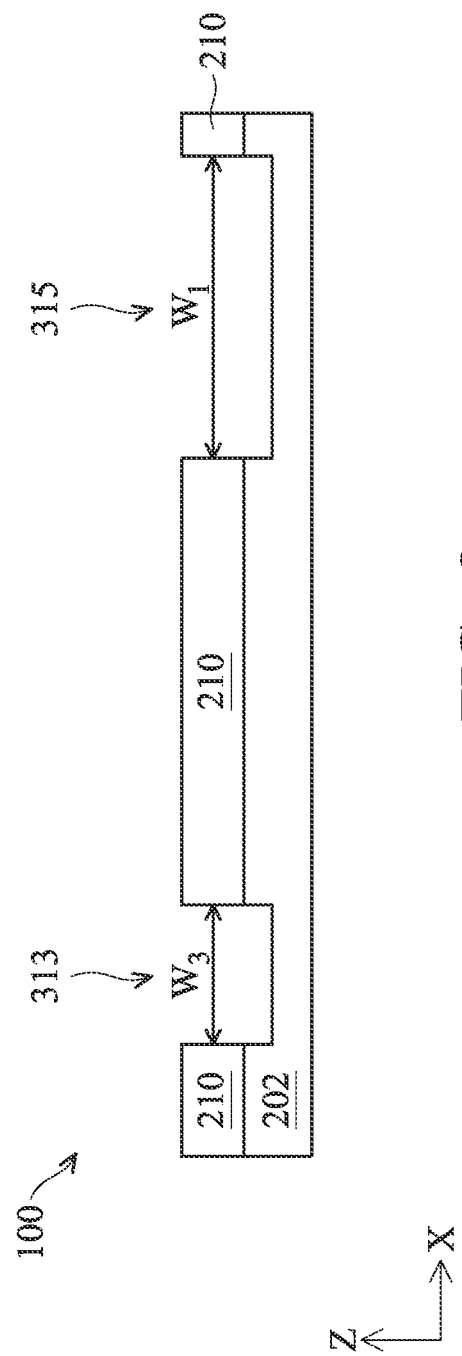
FIGS. 8, 9, 10, 11, 12, 13, 14, and 15 are cross-sectional views of the integrated circuit die in FIG. 1 in a seal ring region, along the "A-A" line, during fabrication processes according to the method in FIG. 7 according to an embodiment.

At operation 702, referring to FIGS. 7 and 8, the method 700 forms a dielectric layer 210 over the substrate 202. Detail of the dielectric layer 210 is introduced above with respect to FIG. 2 and therefore is not repeated here.

At operation 704, still referring to FIGS. 7 and 8, the method 700 etches a trench 313 and a trench 315 into the interlayer 210 and the substrate 202. The trench 313 has a width $w_3$ and the trench 315 has a width $w_1$. The operation 704 may use photolithography to form an etch mask over the interlayer 210 and then etch the interlayer 210 and the substrate 202 through the etch mask to form the trenches 313 and 315. The photolithography may use EUV lithography, DUV lithography, immersion lithography, or other lithography. The etching may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. The trench 313 and the trench 315 may each be formed into a closed ring such as the shape of the PERs 222 shown in FIG. 6. The operation 704 may form a plurality of trenches 313 and 315 in the seal ring region.

Figure 9:
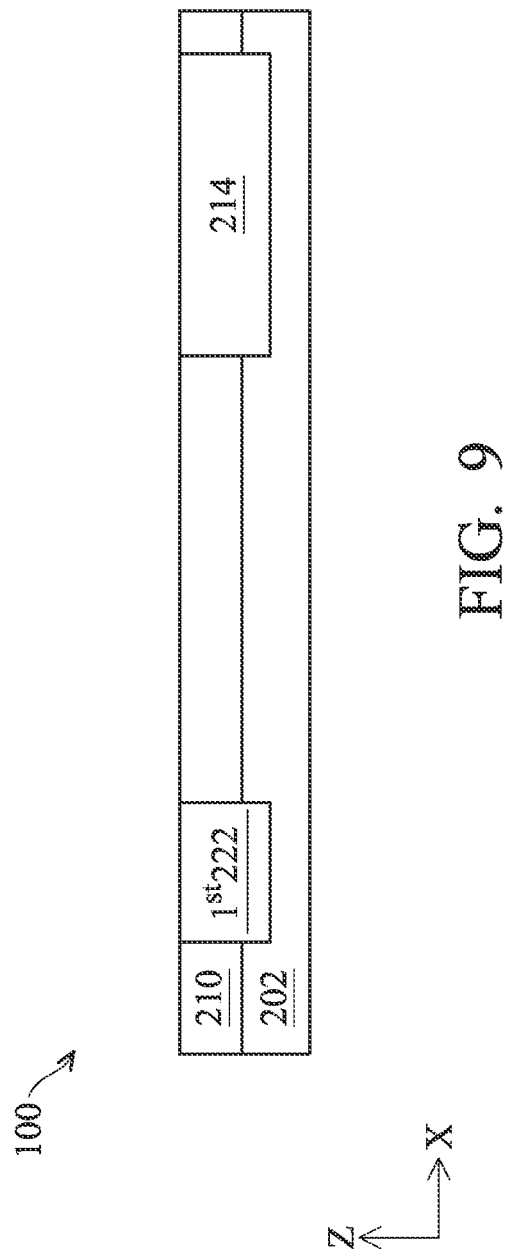

At operation 706, the method 700 (FIG. 7) deposits a first layer of the PER 222 into the trench 313 as shown in FIG. 9. The first layer of the PER 222 penetrates through the dielectric layer 210 and into the substrate 202. The first layer of the PER 222 may include tungsten (W), cobalt (Co), molybdenum (Mo), ruthenium (Ru), or other metals, and may be formed by CVD, PVD, ALD, plating, or other suitable processes. In addition, the metal plug 214 is formed in the operation 706. Details of the metal plug 214 is discussed above with respect to FIG. 2, and therefore not repeated here.

At operation 708, referring to FIGS. 7 and 9, the method 700 performs a CMP process to remove excessive materials of the PERs 222 and the metal plug 214, such that a top surface of PER 222 is coplanar, or substantially coplanar, with a top surface of the dielectric layer 210 and a top surface of the metal plug 214. The CMP process prepares the semiconductor structure 100 for subsequent processes, such as the forming of additional layers of PER 222 explained in detail below.

Figure 10:
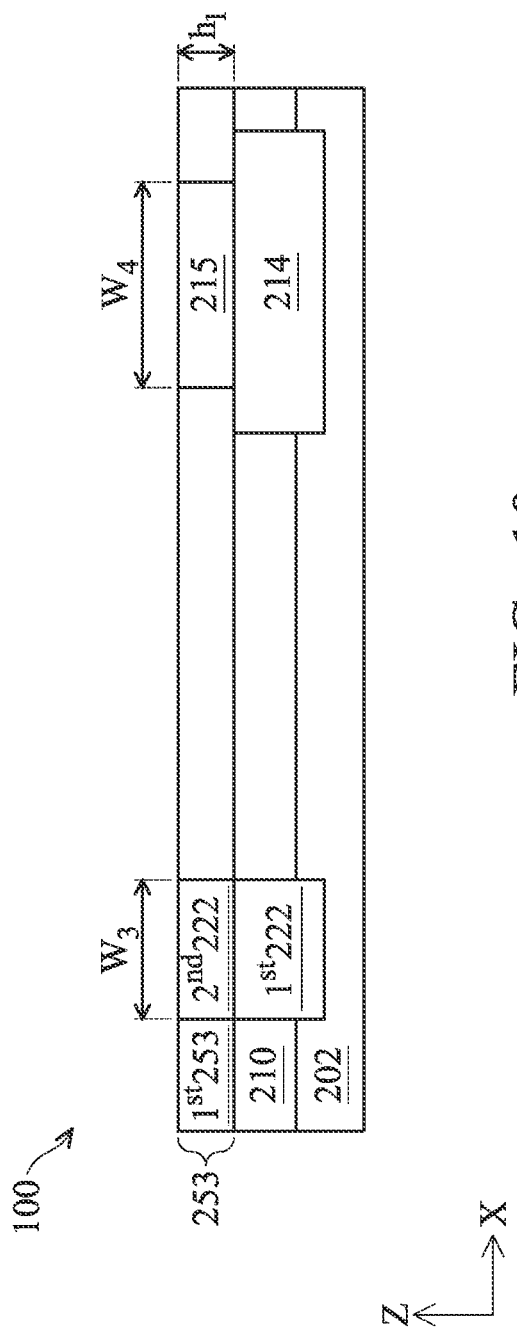

At operation 710, referring to FIGS. 7 and 10, the method 700 repeats the operations 702 to 708 to form additional layers of the PER 222 over the first layer of the PER 222. For example, the method 700 deposits a first dielectric layer 253 over the dielectric layer 210, forms a trench (not shown) in the first dielectric layer 253 over the first layer of the PER 222, deposits a second layer of the PER 222 in the trench, and performs a second CMP to form a substantially coplanar top surface. The second layer of the PER 222 has the same, or substantially the same, footprint as the first layer of the PER 222 and is aligned vertically over the first layer of the PER 222. The first dielectric layer 253 has a height $h_1$ measured along Z direction. A via 215 may be formed in the dielectric layer 253 over the metal plug 214 during the forming of the second layer of the PER 222. The via 215 has a width $w_4$ that is greater than the width $w_3$. In one example, a ratio of the width $w_4$ to the width $w_3$ is about 1.5 to about 3.

Figure 11:
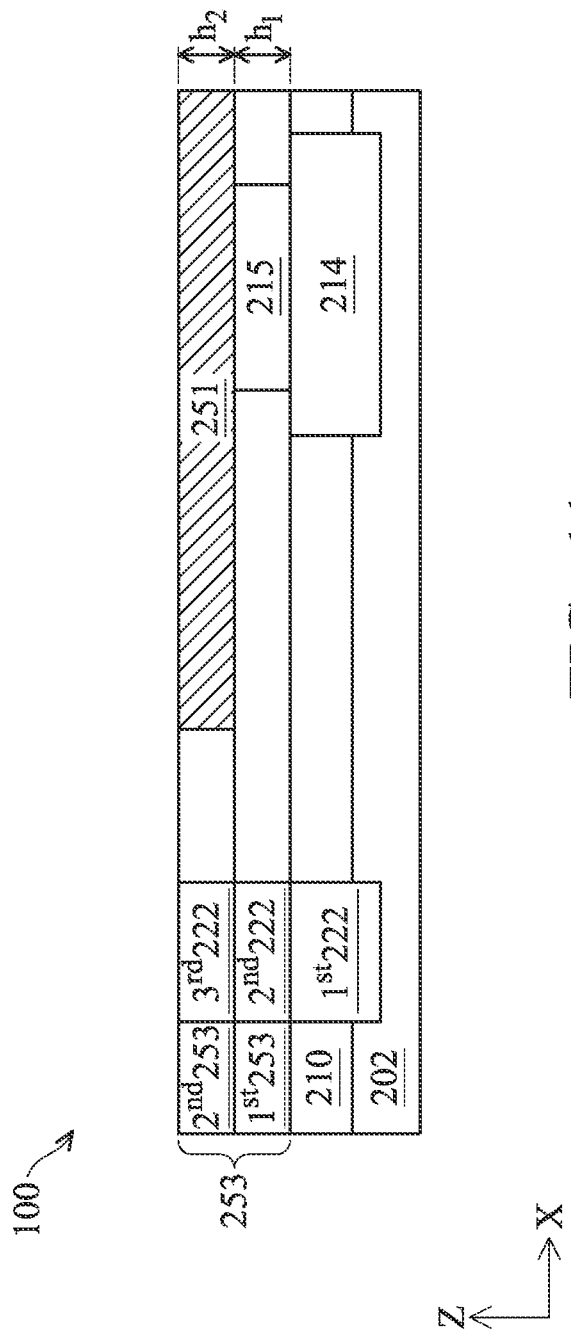

Similarly, referring to FIG. 11, the method 700 forms a second dielectric layer 253 over the first dielectric layer 253, where a third layer of the PER 222 is embedded therein. A metal line 251 is formed in the second dielectric layer 253 during the forming of the third layer of the PER 222. The second dielectric layer 253 has a height $h_2$ measured along Z direction.

Figure 12:
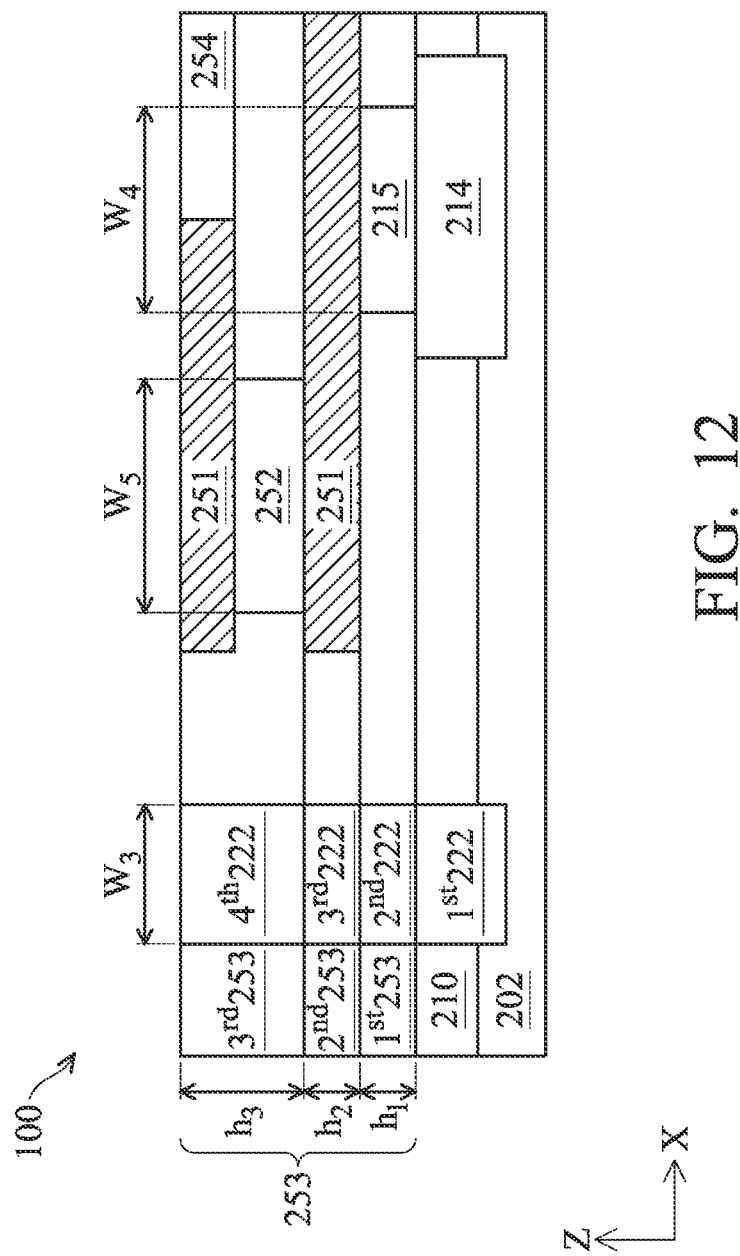

Thereafter, referring to FIG. 12, the method 700 further forms a third dielectric layer 253, where a fourth layer of the PER 222 is embedded therein. Different from the second dielectric layer 253, the third dielectric layer 253 embeds a via 252 and a metal line 251. The via 252 has a width $w_5$ that is greater than the width $w_3$. In one example, the width $w_5$ ranges between 0.1 μm and 0.3 μm. In another example, a ratio of the width $w_5$ to a width $w_3$ is about 1.5 to about 7. In yet another example, a ratio of the width $w_5$ to a width $w_3$ ranges between 2 to about 5. The third dielectric layer 253 further includes a metal bar 254 disposed in a first horizontal plane with the metal line 251. The first horizontal plane is different from (e.g., parallel to) a second horizontal plane the via 252 is disposed in.

Process wise, the trench for the fourth layer of the PER 222 and the trenches for the via 252, and the metal line 251 are formed in the third dielectric layer 253 and then filled by corresponding materials. The metal bar 254 is formed in the same process as the meal line 251. The third dielectric layer 253 has a height $h_3$ that is greater than a height $h_2$ of the second dielectric layer 253 and a height $h_1$ of the first dielectric layer 253. The metal bar 254 has the same height as the metal layer 251. A top surface and a bottom surface of the metal bar 254 are coplanar with a top surface and a bottom surface of the metal layer 251, respectively. The metal line 251 and the metal bar 254 has top surfaces coplanar with the third dielectric layer 253. The via 252 has a bottom surface coplanar with a bottom surface of the third dielectric layer 253.

Figure 13:
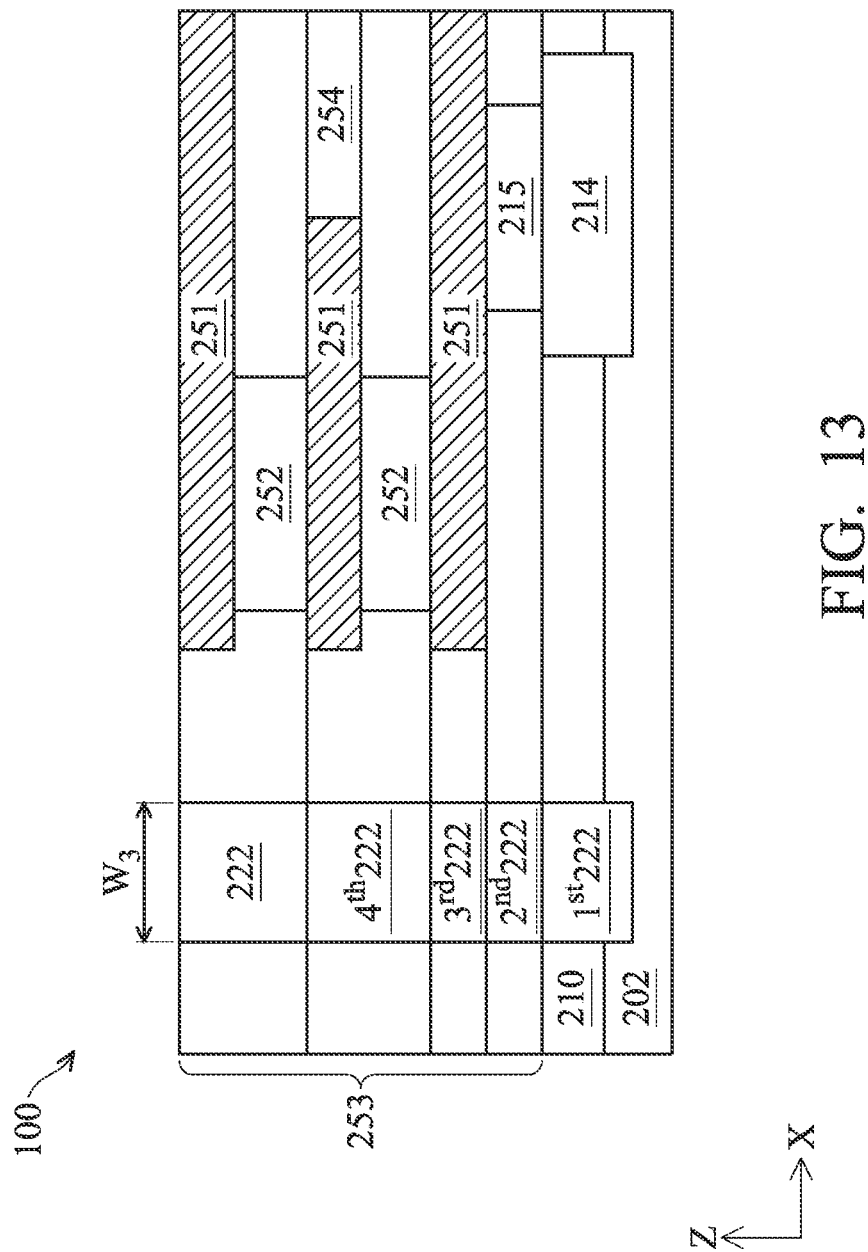

The method 700 repeat the steps 702 to 708 to form additional layers similar to the third dielectric layer 253 as shown in FIG. 13. The numbers of the dielectric layers 253 are decided according to the layers required by the circuit elements 150. In one example, the semiconductor structure 100 includes 3 to 6 layers of dielectric layers 253, depending on individual circuit designs. Different layers of the dielectric layer 253 may include different materials. In the present embodiments, different layers of the dielectric layer 253 include the same materials and are formed in separate steps. For example, the second dielectric layer 253 is formed after the first dielectric layer 253.

Figure 14:
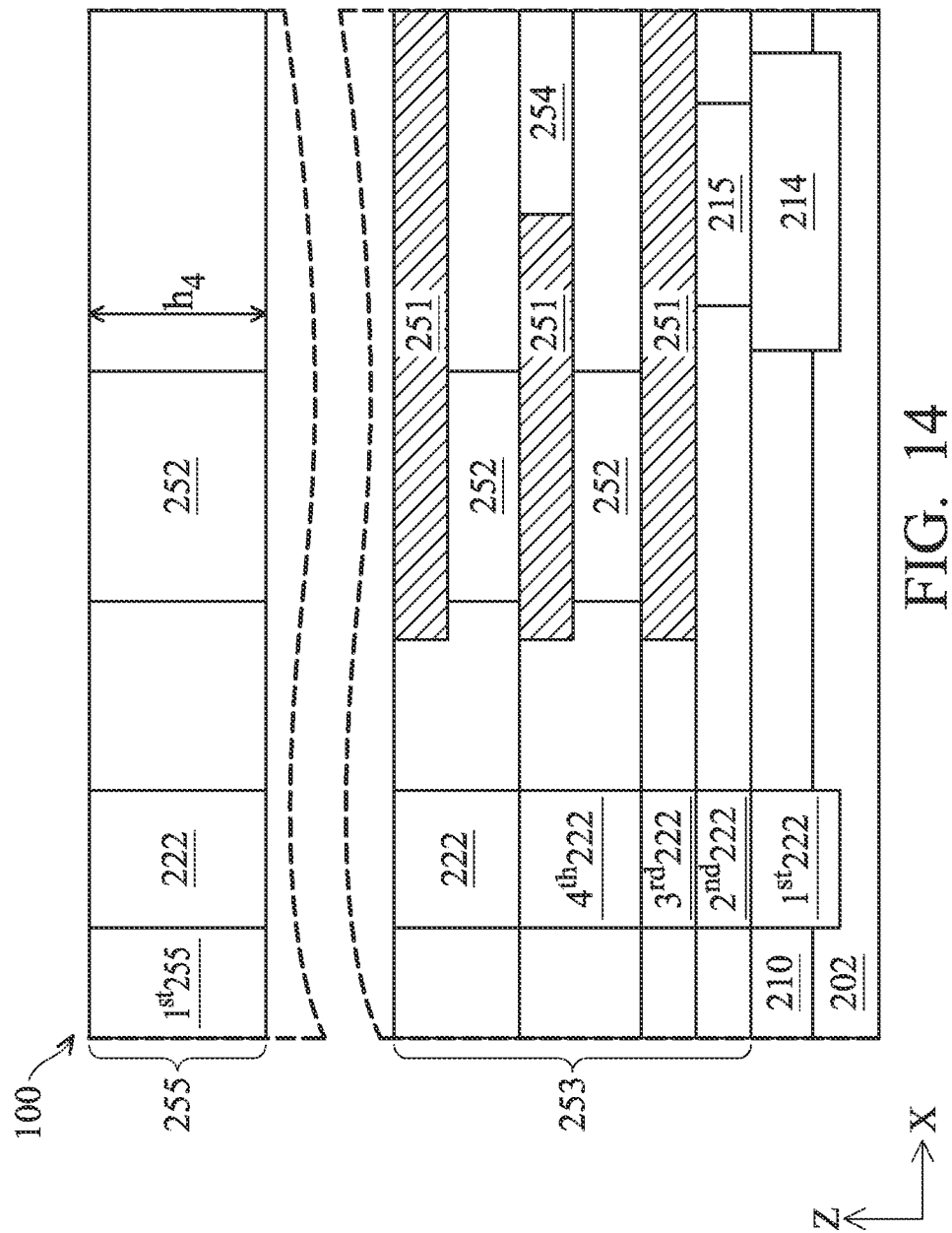

Referring to FIG. 14, the method 700 further forms a first layer of dielectric layer 255 over the layers of the dielectric layer 253. A layer of the PER 222 and a via 252 are formed in the first dielectric layer 255. The dielectric layer 255 has a height $h_4$ that is greater than the height $h_1$ and $h_2$. In an example, the height $h_4$ is substantially the same as the height $h_3$.

Figure 15:
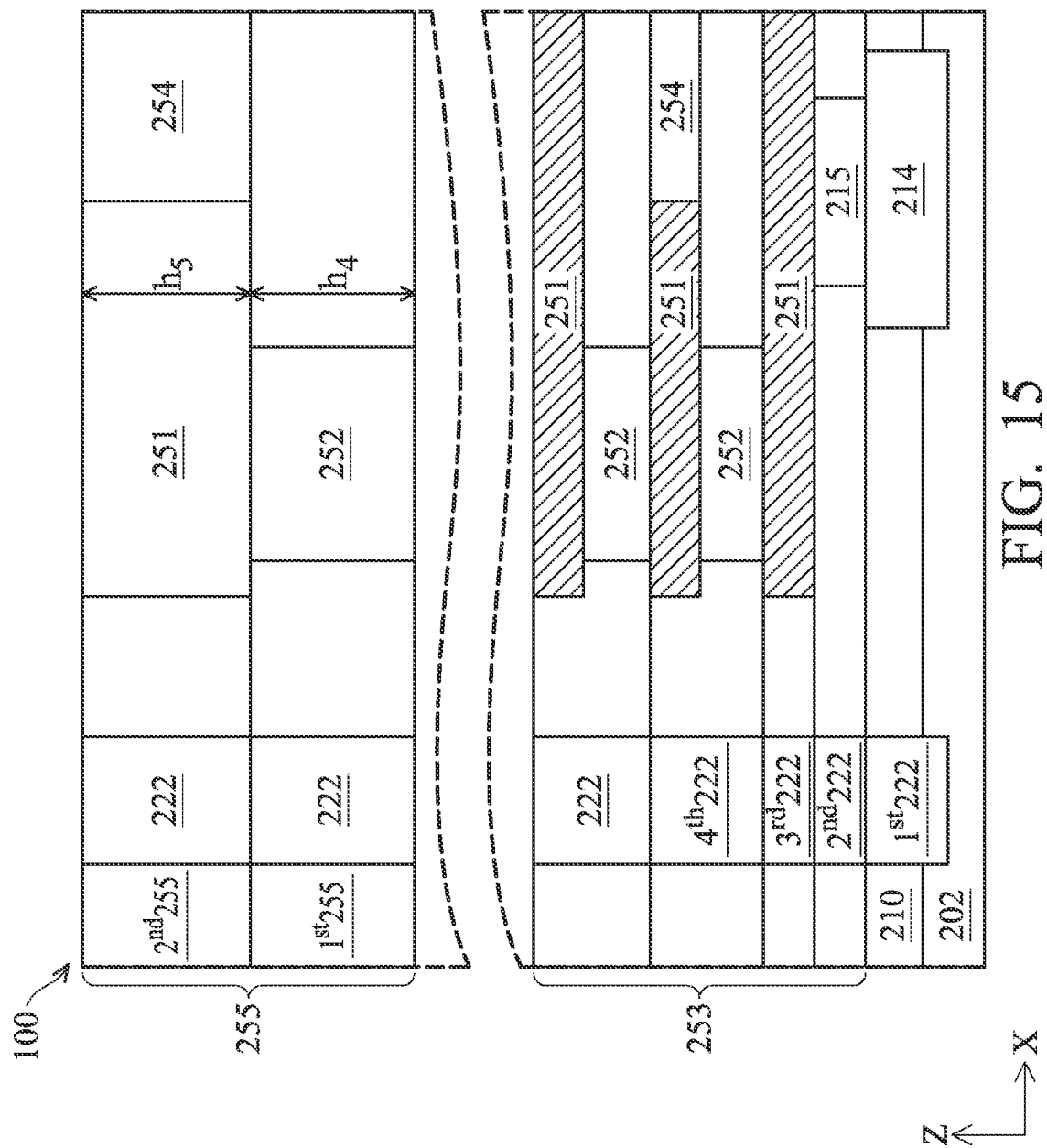

Thereafter, referring to FIG. 15, the method 700 forms a second layer of dielectric layer 255 embedding a layer of the PER 222 and a metal line 251. A height $h_5$ of the second dielectric layer 253 is substantially the same as the height $h_4$. The method 700 further forms a metal bar 254 in the second layer of dielectric layer 255 in the same processes of forming the metal lines 251. The top surfaces of the metal bar 254, the metal line 251, and the second layer of the dielectric layer 255 are coplanar, while the bottom surfaces of the metal bar 254, the metal line 251, and the second layer of the dielectric layer 255 are coplanar. Different from the dielectric layers 253 where the vias 252, the metal layer 251, and the metal bar 254 may be formed in one dielectric layer 253 and in different horizontal planes, each dielectric layer 255 includes either the metal line 251 and the metal bar 254 or the via 252. In other words, the metal line 251 and the metal bar 254 are disposed in same layers of the dielectric layer 255, which are different from the layers of the dielectric layer 255 the via 252 disposed in.

Thereafter, the method 700 forms pairs of dielectric layers 255 similar to the first and the second layers of the dielectric layers 255 until desired numbers of layers are achieved. The desired numbers of layers equal to the numbers of layers in the circuit elements 150 per design requirements. In one example, the semiconductor structure 100 includes 4 to 10 layers of dielectric layers 255. Different layers of dielectric layers 255 may include different materials. In the present embodiments, the dielectric layers 255 includes the same materials and are formed in different processes. For example, the second layer of dielectric layers 255 is formed after the forming of the first layer of the dielectric layer 255.

The layers of the PER 222 disposed in the layers of the dielectric layers 253 and 255 forms a PER 222. Each layer of the PER 222 has the same composition, footprint, and width. FIGS. 7 to 15 depict the forming process of one PER 222 and a portion of the seal ring next to the PER 222. However, the method 700 may form multiple PERs 222 and seal rings, such as the PERs 222*a*, 222*b*, 222*c*, the seal rings 240, 242, 244, and 246 as shown in FIG. 2.

At operation 712, the method 700 (FIG. 7) performs further fabrications to the semiconductor structure 100. For example, the method 700 may form the passivation layer 260 over the dielectric layers 255, the aluminum pad 264 over the passivation layer 260, the passivation layers 262 over the passivation layer 260 and the aluminum pad 264, and the layer 266. Detail of the additional formed layers is discussed with respect to the FIG. 2 and therefore is not repeated here.

Although not intended to be limiting, embodiments of the present disclosure provide one or more of the following advantages. For example, embodiments of the present disclosure provide various seal ring structures in circuit die having one or more groups of property enhancing rings (PERs) disposed between sections of the seal rings. Each group includes one or more PERs configured as a ring shape surrounding the device area of the circuit die. The PERs improves the ability of the seal ring to withstand stress during dicing. In addition, the PERs substantially reduce or eliminate dishing in the seal ring region during chemical mechanical planarization (CMP) processing. Embodiments of the present disclosure can be readily integrated into existing semiconductor manufacturing processes.

In one example aspect, the present disclosure is directed to a semiconductor structure. The semiconductor structure includes dielectric layers disposed over a semiconductor substrate; and a seal ring structure formed in the dielectric layers and distributed in multiple metal layers. The seal ring structure further includes first metal lines of a metal layer disposed in a first area and longitudinally oriented along a first direction; second metal lines of the metal layer disposed in a second area and longitudinally oriented along the first direction; and metal bars of the metal layer disposed in the first area and longitudinally oriented along a second direction, the metal bars connecting the first metal lines.

In another example aspect, the present disclosure is directed to a semiconductor structure. The semiconductor structure includes a substrate having a circuit region and a seal ring region surrounding the circuit region; dielectric layers disposed over the substrate; and a seal ring structure disposed within the seal ring region and formed in the dielectric layers. The seal ring structure includes a first seal ring and a second seal ring each includes metal lines horizontally connected by metal bars and vertically connected by vias; and a group of property enhancing rings (PERs) disposed between the first seal ring and the second seal ring. The PERs are disconnected from and spaced apart from each other. Each of the PERs has a first width that is less than a second width of each metal lines.

In yet another example aspect, the present disclosure is directed to a method of forming a semiconductor structure. The method includes providing a semiconductor substrate having a circuit region and a seal ring region surrounding the circuit region; forming a dielectric layer on the semiconductor substrate; and forming a metal layer in the dielectric layer. The metal layer is patterned to include first metal lines in the circuit region; second metal lines disposed in a first area of the seal ring region and longitudinally oriented along a first direction; third metal lines of the metal layer disposed in a second area of the seal ring region and longitudinally oriented along the first direction; and metal bars of the metal layer disposed in the first area of the seal ring region and longitudinally oriented along a second direction. Each of the metal bars spans between adjacent two of the second metal lines. The third metal lines are separated from each other by the dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   dielectric layers disposed over a semiconductor substrate; and
   a seal ring structure formed in the dielectric layers and distributed in multiple metal layers, wherein the seal ring structure further includes
   first metal lines of a metal layer disposed in a first area and longitudinally oriented along a first direction;
   second metal lines of the metal layer disposed in a second area and longitudinally oriented along the first direction;
   first metal bars of the metal layer disposed along a first metal bar line in the first area and longitudinally oriented along a second direction, the first metal bars connecting the first metal lines; and
   second metal bars disposed along a second metal bar line parallel to the first metal bar line, wherein the second metal bars connect the first metal lines that are not connected by the first metal bars.

2. The semiconductor structure of claim 1, wherein the first metal lines each has a first width and the second metal lines each has a second width, and wherein the first width is greater than the second width.

3. The semiconductor structure of claim 1, wherein the second area is free of the metal bars.

4. The semiconductor structure of claim 1, wherein
   each of the metal bars spans between adjacent two of the first metal lines along the second direction; and
   the second direction is perpendicular to the first direction.

5. The semiconductor structure of claim 4, wherein the metal bars connect every other first metal lines.

6. The semiconductor structure of claim 1, further comprising third metal lines of the metal layer disposed in a third area and longitudinally oriented along the first direction, wherein the third metal lines each has a width the same as a width of each of the first metal lines, and wherein the second metal lines are disposed between the first and the third metal lines.

7. A semiconductor structure, comprising:
   a substrate having a circuit region and a seal ring region surrounding the circuit region;
   dielectric layers disposed over the substrate; and
   a seal ring structure disposed within the seal ring region and formed in the dielectric layers, wherein the seal ring structure includes:
   a first seal ring and a second seal ring each includes metal lines horizontally connected by metal bars and vertically connected by vias; and
   a group of property enhancing rings (PERs) disposed between the first seal ring and the second seal ring, wherein the PERs are disconnected from and spaced apart from each other, and wherein each of the PERs has a first width that is less than a second width of each metal lines.

8. The semiconductor structure of claim 7, wherein a first distance between adjacent PERs is less than a second distance between adjacent metal lines in a top view.

9. The semiconductor structure of claim 8, wherein a ratio of the first distance to a second distance is about 0.15 to about 0.25.

10. The semiconductor structure of claim 7, wherein a ratio of the second width to the first width ranges between 2 and 6.

11. The semiconductor structure of claim 7, wherein the group of PERs is a first group of PERs, wherein the semiconductor structure further comprises:
    a third seal ring encloses the second seal ring; and
    a second group of PERs between the second seal ring and the third seal ring.

12. The semiconductor structure of claim 11, wherein the first group of PERs includes a first number of PERs and the second group of PERs includes a second number of PERs, and wherein the first number is greater than the second number.

13. The semiconductor structure of claim 12, wherein the semiconductor structure further comprises:
    a fourth seal ring encloses the third seal ring; and
    a third group of PERs between the third seal ring and the fourth seal ring, wherein the third group of PERs includes a third number of PERs equals to the second number.

14. The semiconductor structure of claim 7, wherein the group of PERs is free of contact from the metal bars.

15. A method, comprising:
    providing a semiconductor substrate having a circuit region and a seal ring region surrounding the circuit region;
    forming a dielectric layer on the semiconductor substrate; and
    forming a metal layer in the dielectric layer, wherein the metal layer is patterned to include
    forming first metal lines in the circuit region;
    forming second metal lines disposed in a first area of the seal ring region and longitudinally oriented along a first direction;
    forming third metal lines of the metal layer disposed in a second area of the seal ring region and longitudinally oriented along the first direction; and
    forming metal bars of the metal layer disposed in the first area of the seal ring region and longitudinally oriented along a second direction, wherein each of the metal bars spans between adjacent two of the second metal lines, and wherein the third metal lines are separated from each other by the dielectric layer;

forming fourth metal lines in a third area of the seal ring region and longitudinally oriented along the first direction;

forming additional metal bars of the metal layer disposed in the third area of the seal ring region and longitudinally oriented along the second direction, wherein each of the metal bars spans between adjacent two of the fourth metal lines; and forming fifth metal lines in a fourth area of the seal ring region and longitudinally oriented along the first direction, wherein the fifth metal lines are separated from each other by the dielectric layer, wherein the fifth metal lines include a greater number of metal lines than the third metal lines.

16. The method of claim 15, wherein the third metal lines each has a width less than a width of each of the second metal lines.

17. The method of claim 15, wherein the first direction is perpendicular to the second direction.

18. The semiconductor structure of claim 1, wherein the seal ring structure includes:

a first seal ring and a second seal ring, wherein the first seal ring includes the first and second metal lines, and the first and second metal bars, and wherein the second seal ring includes third metal lines horizontally connected by third metal bars; and a group of property enhancing rings (PERs) disposed between the first seal ring and the second seal ring, wherein the PERs are disconnected from and spaced apart from each other.

19. The semiconductor structure of claim 18, wherein a first distance between adjacent PERs is less than a second distance between adjacent the third metal lines in a top view, each of the PERs has a first width that is less than a second width of third metal lines.

20. The semiconductor structure of claim 19, wherein a ratio of the first distance to a second distance is about 0.15 to about 0.25; and a ratio of the second width to the first width ranges between 2 and 6.

* * * * *